United States Patent [19]
Yiu et al.

[11] Patent Number: 5,745,410
[45] Date of Patent: Apr. 28, 1998

[54] METHOD AND SYSTEM FOR SOFT PROGRAMMING ALGORITHM

[75] Inventors: Tom Dang-Hsing Yiu, Milpitas, Calif.; Fuchia Shone, Hsinchu, Taiwan; I-Long Lee, I-Lan Hsian, Taiwan; Chia-Shing Chen, I-Lan Hsian, Taiwan; Hun-Song Chen, Kee-Lung City, Taiwan; Yuan-Chang Liu, Miao-Li City, Taiwan; Tzeng-Huei Shiau, Hsin-Chu Hsian, Taiwan; Kuen-Long Chang, Taipei, Taiwan; Ray-Lin Wan, Milpitas, Calif.

[73] Assignee: Macronix International Co., Ltd., Taiwan

[21] Appl. No.: 619,485

[22] PCT Filed: Nov. 17, 1995

[86] PCT No.: PCT/US95/15051

§ 371 Date: Mar. 21, 1996

§ 102(e) Date: Mar. 21, 1996

[87] PCT Pub. No.: WO97/19452

PCT Pub. Date: May 29, 1997

[51] Int. Cl.⁶ .................................................. G11C 11/40
[52] U.S. Cl. ........................... 365/185.3; 365/185.11; 365/185.18; 365/185.29
[58] Field of Search .................. 365/185.3, 185.33, 365/185.26, 185.11, 185.18, 185.14, 185.29

[56] References Cited

U.S. PATENT DOCUMENTS

| | | |
|---|---|---|
| 4,875,188 | 10/1989 | Jungroth . |
| 5,233,562 | 8/1993 | Ong et al. . |
| 5,414,664 | 5/1995 | Lin et al. . |
| 5,416,738 | 5/1995 | Shrivastava . |
| 5,424,993 | 6/1995 | Lee et al. . |
| 5,438,544 | 8/1995 | Makino . |
| 5,508,959 | 4/1996 | Lee et al. ........................... 365/185.3 |

*Primary Examiner*—David C. Nelms
*Assistant Examiner*—Hoai V. Ho
*Attorney, Agent, or Firm*—Wilson Sonsini Goodrich & Rosati

[57] ABSTRACT

A floating gate memory device which includes control circuits to generate a repair pulse to repair over-erased cells so they may be repaired block-by-block. This invention includes repairing the cells by applying a repair pulse to the cell's bit line while maintaining the word line voltage above ground. In a different embodiment, the word line voltage is maintained at two different voltage levels above ground. In the first stage, the word line voltage is maintained between approximately 0.1 volts and 0.2 volts for approximately 100 ms while the repair pulse is applied. In the second stage, the word line voltage is maintained between approximately 0.4 volts and 0.5 volts for approximately 100 ms while the repair pulse is applied.

50 Claims, 9 Drawing Sheets

METHOD AND SYSTEM FOR SOFT PROGRAMMING ALGORITHM

BACKGROUND OF THE INVENTION

1. Field of the Invention

This invention relates to floating gate memory devices, such as flash memory, and in particular to methods and circuits for repairing over-erased floating gate memory cells.

2. Description of Related Art

Non-volatile memory design based on integrated circuit technology represents an expanding field. Several popular classes of non-volatile memory are based on arrays of floating gate memory transistors which are electrically erasable and programmable.

The act of programming a memory array of floating gate memory transistors in one popular approach involves injecting the floating gate of addressed cells with electrons which causes a negative charge to accumulate in the floating gate and the turn-on threshold of the memory cell to increase. Thus, when programmed, the cells will not turn on, that is, they will remain nonconductive when addressed with read potentials applied to the control gates. The act of erasing a cell having a negatively charged floating gate involves removing electrons from the floating gate to lower the threshold. With the lower threshold, the cell will turn on to a conductive state when addressed with a read potential to the control gate. For an opposite polarity array, programming involves selectively removing electrons from the addressed cells' floating gates.

Floating gate memory cells suffer the problem of over-erasure, particularly when erasing involves lowering the threshold by removing electrons from the floating gate. During the erase step, over-erasure occurs if too many electrons are removed from the floating gate leaving a slight positive charge. The positive charge biases the memory cell slightly on, so that a small current may leak through the memory even when it is not addressed. A number of over-erased cells along a given data line can cause an accumulation of leakage current sufficient to cause a false reading.

In addition to causing false readings, when floating gate cells are over-erased, it makes it difficult to successfully reprogram the cells using hot electron programming, particularly with embedded algorithms in the integrated circuits. This difficulty arises because the amount of electrons needed to move an over-erased cell to the programmed state is larger than for normal cells.

Further, because the erase and program operations can affect different cells in a single array differently, floating gate memory designs often include circuitry for verifying the success of the erasing and programming steps. See, for instance, U.S. Pat. No. 4,875,118, entitled VOLTAGE MARGINING CIRCUIT FOR FLASH MEMORY, invented by Jungroth. If the array does not pass erase verify, the entire array is usually re-erased. The re-erase process can aggravate over-erased cells in the array.

One solution to the over-erase problem associated with the erase verification process is disclosed in U.S. Pat. No. 5,414,664, FLASH MEMORY WITH BLOCK ERASE FLAGS FOR OVER-ERASURE PROTECTION, issued to Lin et al. on May 9, 1995, which shows a method and a device where only those blocks which fail the erase verify operation are re-erased. Accordingly, a re-erase of the entire array after each verify operation is not required. This mitigates the over-erase phenomenon, but does not solve it entirely.

Thus, a repair process has been developed to correct over-erased cells. U.S. Pat. No. 5,233,562, entitled METHODS OF REPAIRING FIELD-EFFECT CELLS IN AN ELECTRICALLY ERASABLE AND ELECTRICALLY PROGRAMMABLE MEMORY DEVICE, issued to Ong, et al., describes processes for such repair using so called drain disturb, source disturb or gate disturb techniques. After each repair in the Ong patent, a time consuming repair verification operation of the entire array is provided. See, also, U.S. Pat. No. 5,416,738 to Shrivastava for further background information.

In any case, the repair and repair verification processes are time-consuming. Therefore, a method and device which repairs over-erased cells in FLASH memory, and other floating gate memory, more quickly and efficiently is needed.

SUMMARY OF THE INVENTION

The present invention incorporates a soft program cycle into an erase sequence for a floating gate memory device, which quickly and efficiently repairs over-erased cells. The process is suitable for use in an embedded erase algorithm for integrated circuit flash memory devices and for other floating gate memory architectures.

According to the present invention, a segmentable floating gate memory array is provided with circuitry for applying a soft program repair pulse to an entire sector of floating gate memory cells in parallel. This technique in combination with a sector by sector erase structure, provides a quick and efficient technique for sector erase with soft program repair pulses in a floating gate memory device.

Thus, according to one aspect, the invention can be characterized as a floating gate memory integrated circuit which includes an array of floating gate memory cells. The array includes a plurality of sectors, each including a plurality of drain lines coupled to drain terminals in respective columns of cells in the sector, a plurality of source lines coupled to source terminals in respective columns of cells in the sector, and a plurality of word lines coupled to control gate terminals of respective rows of cells in the sector. Of course, depending on the architecture of the array, a single conductor may act as both a source line and drain line between adjacent memory cells. A control circuit is coupled with the drain lines, source lines and word lines in the plurality of sectors, for setting the threshold voltages of the cells in a selected sector to a low threshold state (erased state) in which the cells have a specified range of threshold voltage. The control circuity includes voltage supply circuits to supply a voltage sequence to lower the threshold of cells in the selected sector which results in some cells having thresholds lowered below the specified range of threshold voltages (over-erased). Following the first voltage sequence to lower the threshold, a repair pulse is applied to the selected sector. The repair pulse is applied during a repair time interval such that it induces a source disturb or a drain disturb soft program effect.

According to one aspect of the invention, the voltage on the word lines is set on a level below the minimum of the specified range of threshold voltages, and above ground. Increased word line voltage enhances the hot electron injection current flowing in the cells subject to the soft program pulse, and speed up the process. In alternative systems, the word lines may be pulled substantially to ground during the repair pulse. To control disturbance of cells in the array, the word line voltages in a preferred system are pulled to a level above ground but less than about 0.5 volts during the repair pulse.

3

According to another aspect of the invention, the control circuit includes circuitry to drive the word lines during the repair pulse in a two step sequence. In a first step of the sequence, the word lines are driven to a first level for a first time interval, and during a second step in a sequence, the word lines are driven to a second higher level for a second time interval. This two level pulse on the word lines is a technique for controlling the amount of current consumed during the soft program cycle. Thus, during the lower voltage first step in the sequence, cells subject to the repair pulse are programmed towards the normal erase state with a controlled current because of a lower word line voltage. After the first step, a second higher voltage level is applied to the word lines. This higher voltage induces greater hot electron injection current for the balance of the soft program pulse, and more effectively repairs cells within a given amount of time. In a preferred system , the repair time interval will last about 200 ms, with the word line voltage held at a first lower level of about 0.1 volts for 100 ms, and then raised to a second higher level of about 0.4 volts for the balance of the 200 ms repair pulse interval. Preferably, during the first step of the repair pulse, the word line voltage is held at a value of between ground and about 0.2 volts. During the second step, the value is held at less than about 0.5 volts and approximately 0.4 volts.

According to the present invention, the repair pulse is applied by driving the plurality of drain lines in a selected sector in the array to a positive voltage, for example of about 5.5 volts, and driving the plurality of source lines substantially to ground. This induces a so-called drain disturb repair pulse. An alternative system may utilize a so-called source disturb repair pulse, which applies a positive voltage to the source while grounding the drain. Furthermore, the current limiting circuitry may be included on at least one of the plurality of drain lines and the plurality of source lines in the sectors in the array. For example, a current limiting transistor may be coupled to the source lines. This prevents the amount of current of any particular sector in the array from consuming the available drive power of the voltage sources which provide the repair pulse.

Accordingly, the present invention provides an embedded erase algorithm with a soft program pulse to quickly and efficiently repair over-erased cells. The pulse is applied sector by sector, or to the entire array in parallel, so that it is accomplished in relatively a short amount of time available for use in commercial integrated circuits. Furthermore, in a preferred embodiment a two step pulse is provided which allows for soft programming with a lower voltage on the bit line, for faster soft programming without disturbing properly erased cells, and manages the current consumed during the soft programming operation.

Other aspects and advantages of the present invention can be seen upon review of the figures, the detailed description and the claims which follow.

4

Figure 6:
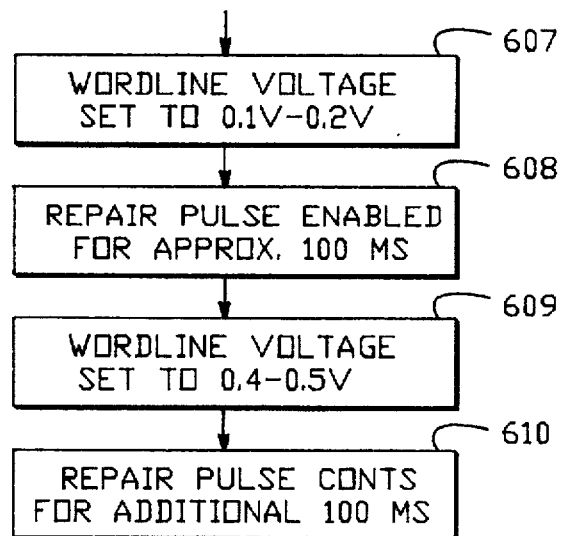

FIG. 6 is a flow chart illustrating a two stage soft programming process of this invention.

Figure 7:
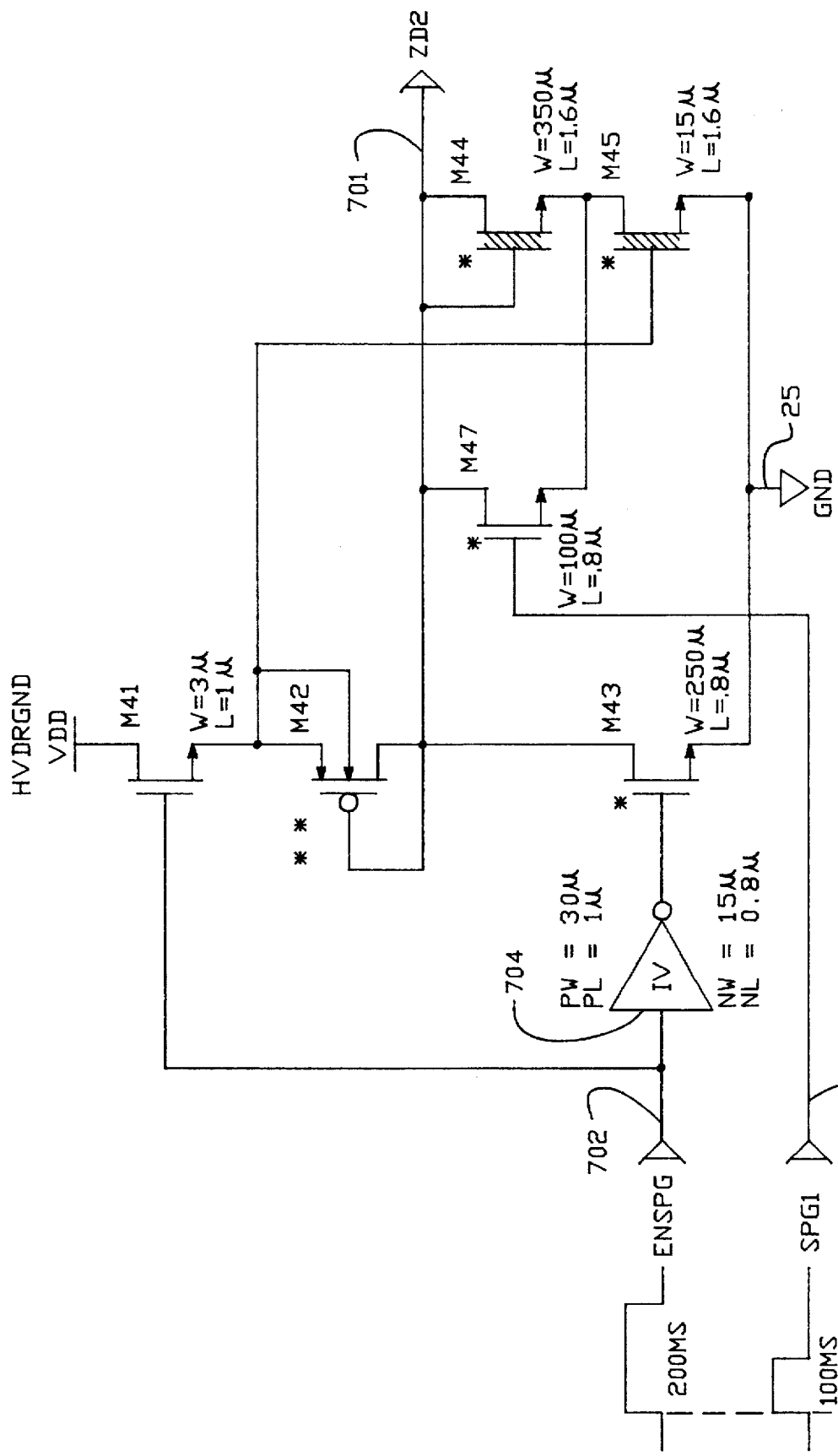

FIG. 7 is a circuit diagram of a three level pull down for a word line driver according to the present invention.

Figure 8:
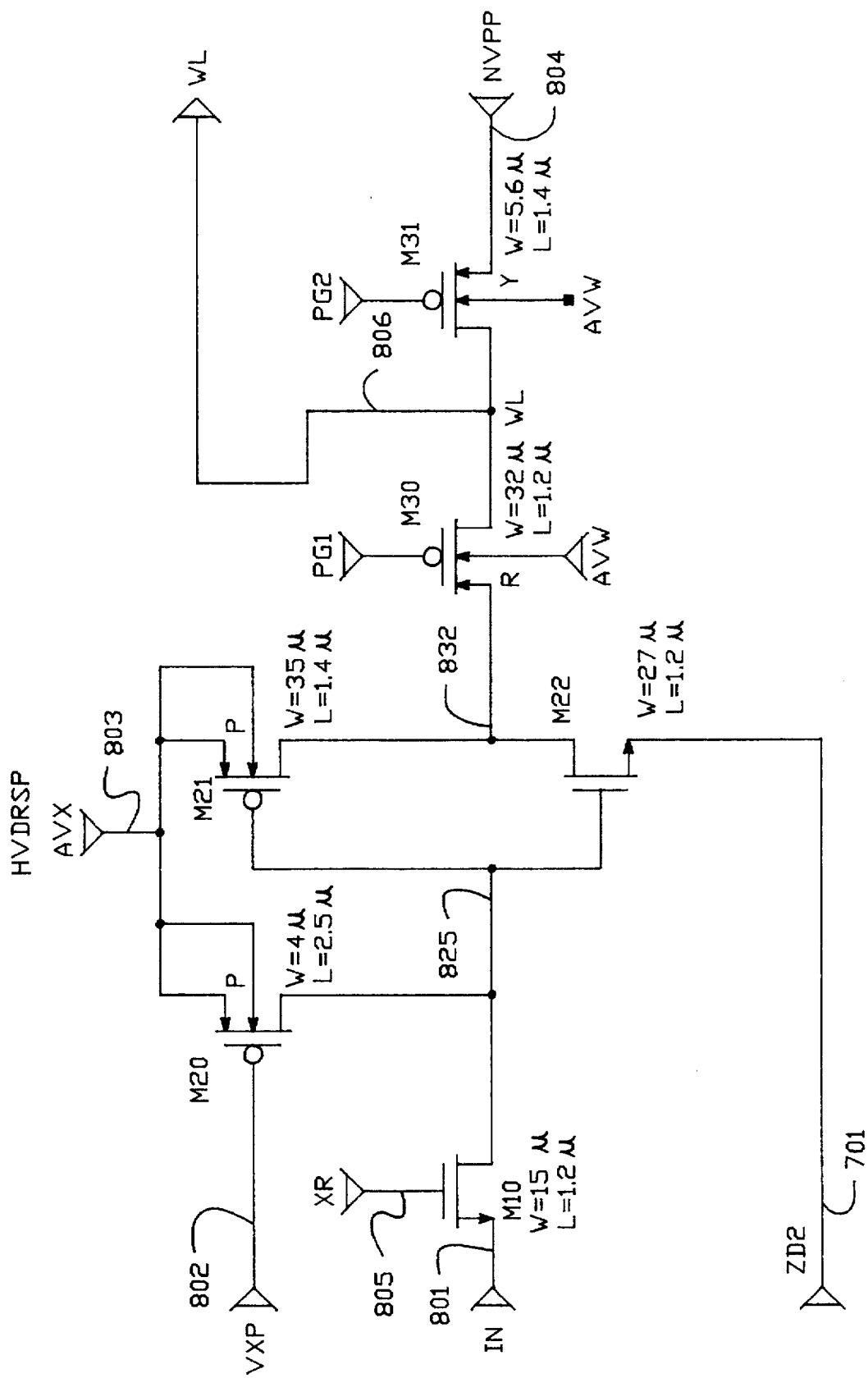

FIG. 8 is a circuit diagram showing word line driver circuit elements for use with the circuit of FIG. 7.

Figure 9:
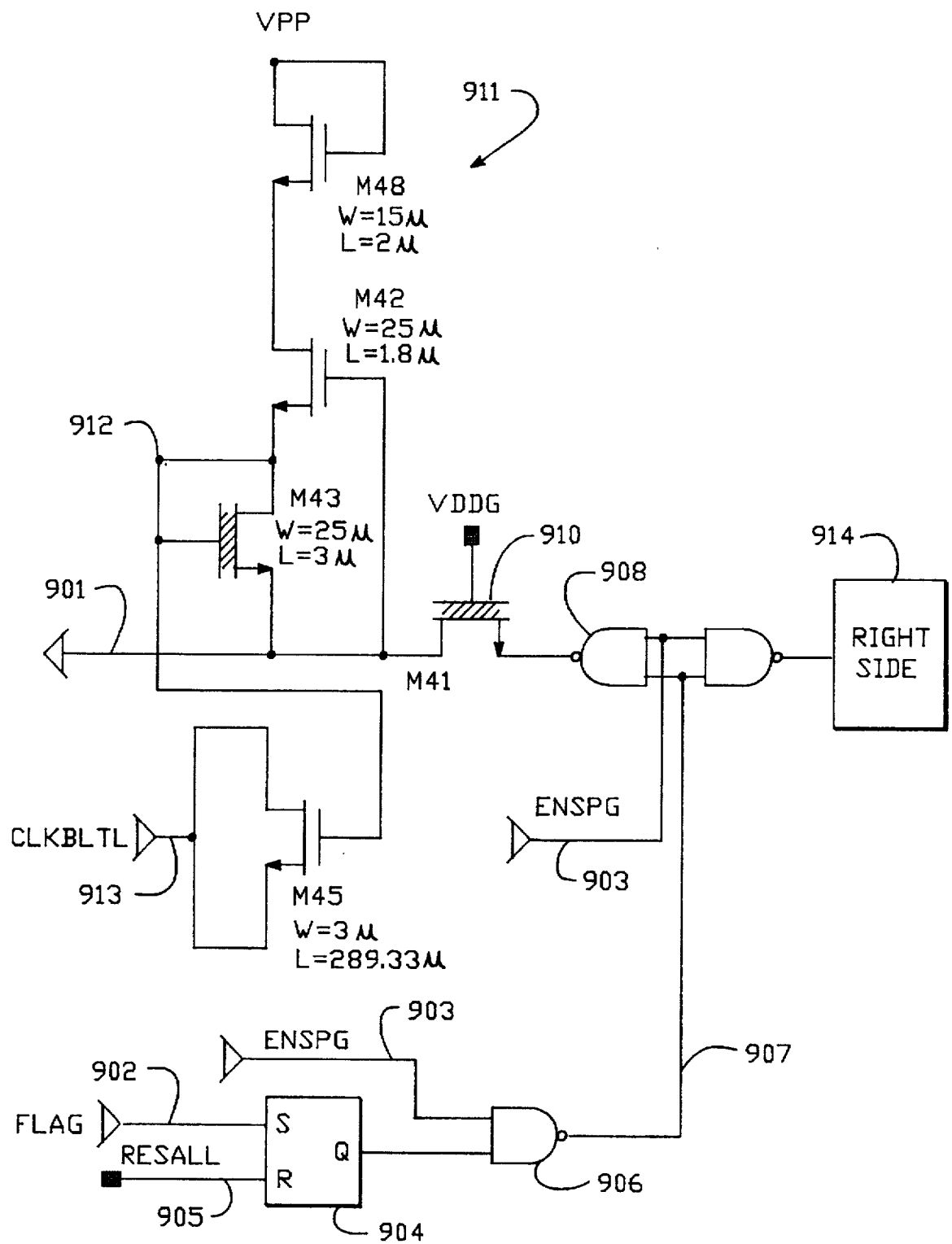

FIG. 9 is a schematic diagram of a top block select driver for applying a repair pulse according to this present invention.

Figure 10:
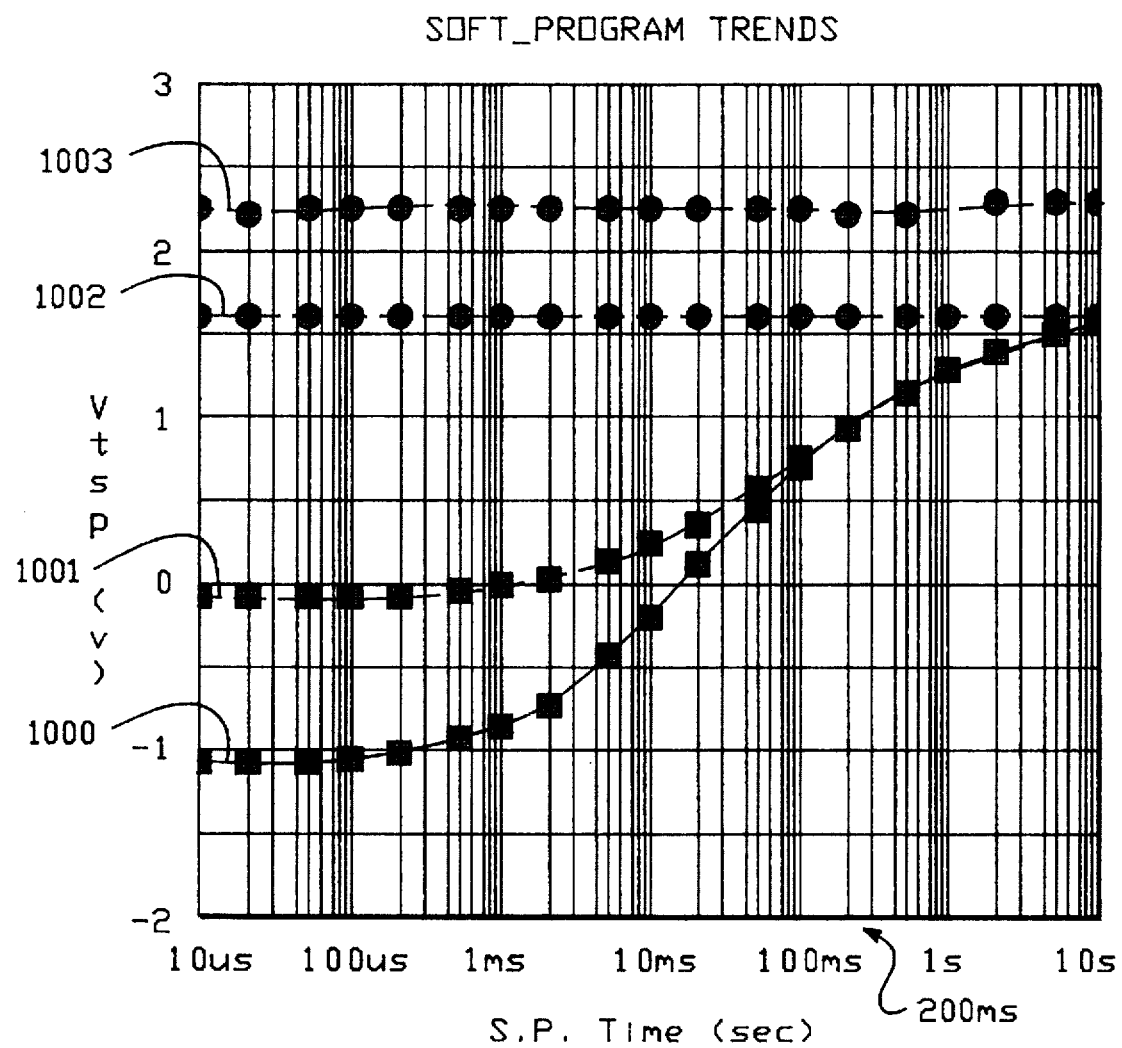

FIG. 10 is a graph showing effects of soft program pulses according to the present invention.

DETAILED DESCRIPTION

A detailed description of preferred embodiments of this invention is provided with reference to the figures. The soft program of this invention is preferably part of an embedded erase sequence of a floating gate memory cell device, such a device including an array of cells arranged in blocks. The soft program generates pulses for quickly repairing over-erased cells block by block, while limiting the amount of current generated during the process.

Figure 1:
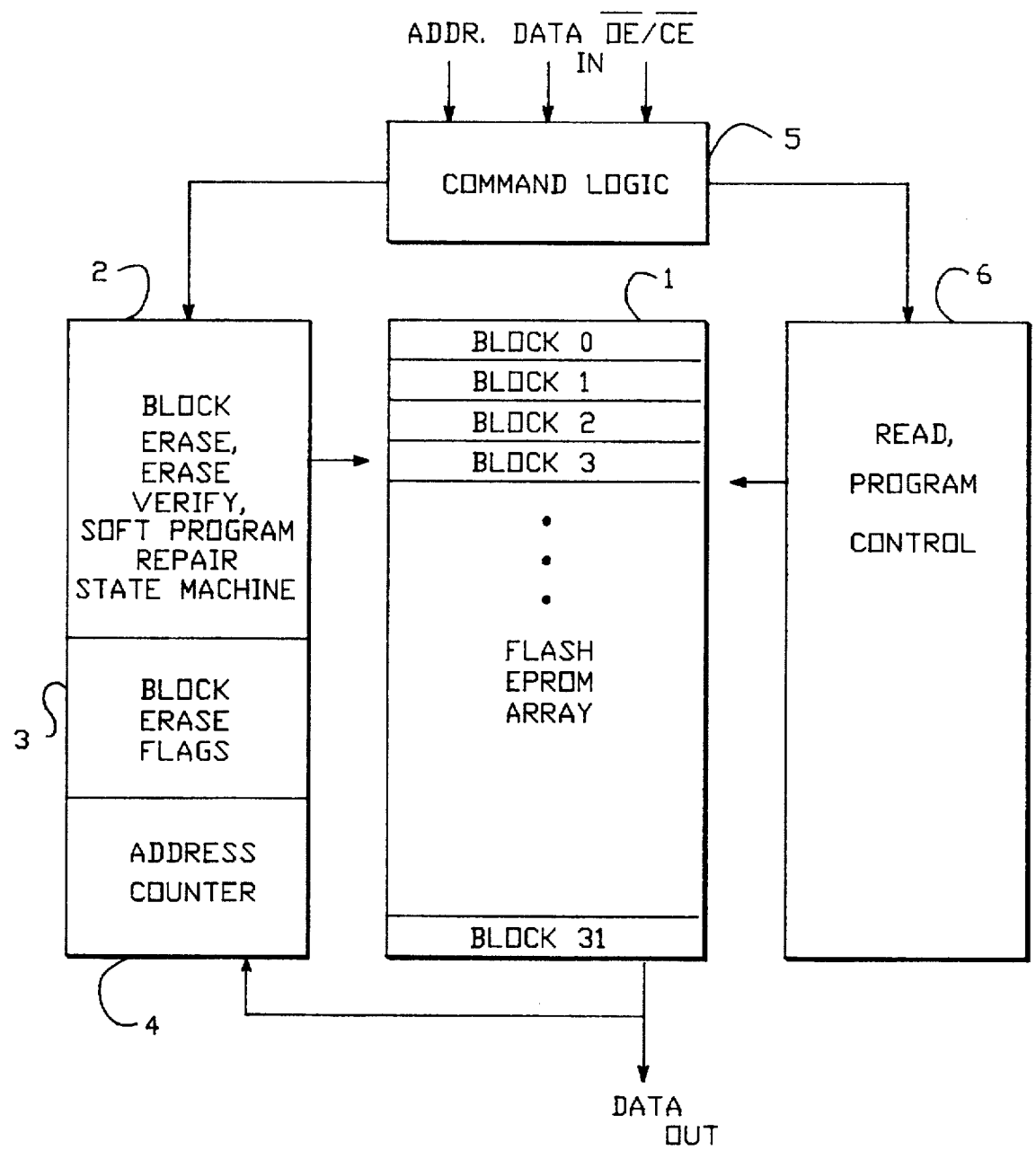
FIG. 1 is a schematic block diagram providing an overview of an integrated circuit according to the present invention.

FIG. 1 shows the basic structure of a 4 megabyte floating gate memory cell integrated circuit incorporating this invention. The circuit includes a memory array, generally 1, which is divided into a plurality of blocks (32 blocks in the figure). The segmentable architecture of the memory array allows application of the repair pulse of this invention to cell blocks individually, thus allowing block by block repair of over-erased cells. The array architecture is described in detail below with reference to FIG. 2.

Still referring to FIG. 1, coupled with the array 1 are a read and program control circuit, generally 6, and a block erase/erase verify/ repair circuit, generally 2. The block erase/erase verify/repair circuit 2 is coupled to block erase flags 3. An address counter 4 is included for incrementing through memory cells, blocks or the entire array for the erase/erase verify/repair sequence.

The chip includes command logic 5 which is coupled to the address, data, and other control lines such as the output enable and chip enable signals. The command logic 5 interprets inputs to set a mode of operation for the read and program control logic 6 and the block erase/erase verify/ repair circuit 2.

Command logic 5 may be implemented as done in standard floating gate memory integrated circuits, such as Am28F020 flash memory chip manufactured by Advanced Micro Devices, Inc. of Sunnyvale, Calif. with additional commands of this invention for cell, block or array erase. In response to commands issued by the command logic 5, an embedded erase operation is executed by state machines in the erase/erase verify/repair circuit 2. The user, through a host CPU or otherwise, supplies address and data signals to the command logic 5 to indicate a preferred mode of operation. The modes executed by erase/erase verify/repair circuit 2 include a chip erase mode in which all blocks in the array 1 are to be erased and a block erase mode in which selected blocks in the array 1 are to be erased. In response to user input, blocks to be erased are identified by block or sector erase flags 3 stored on the chip.

Figure 2:
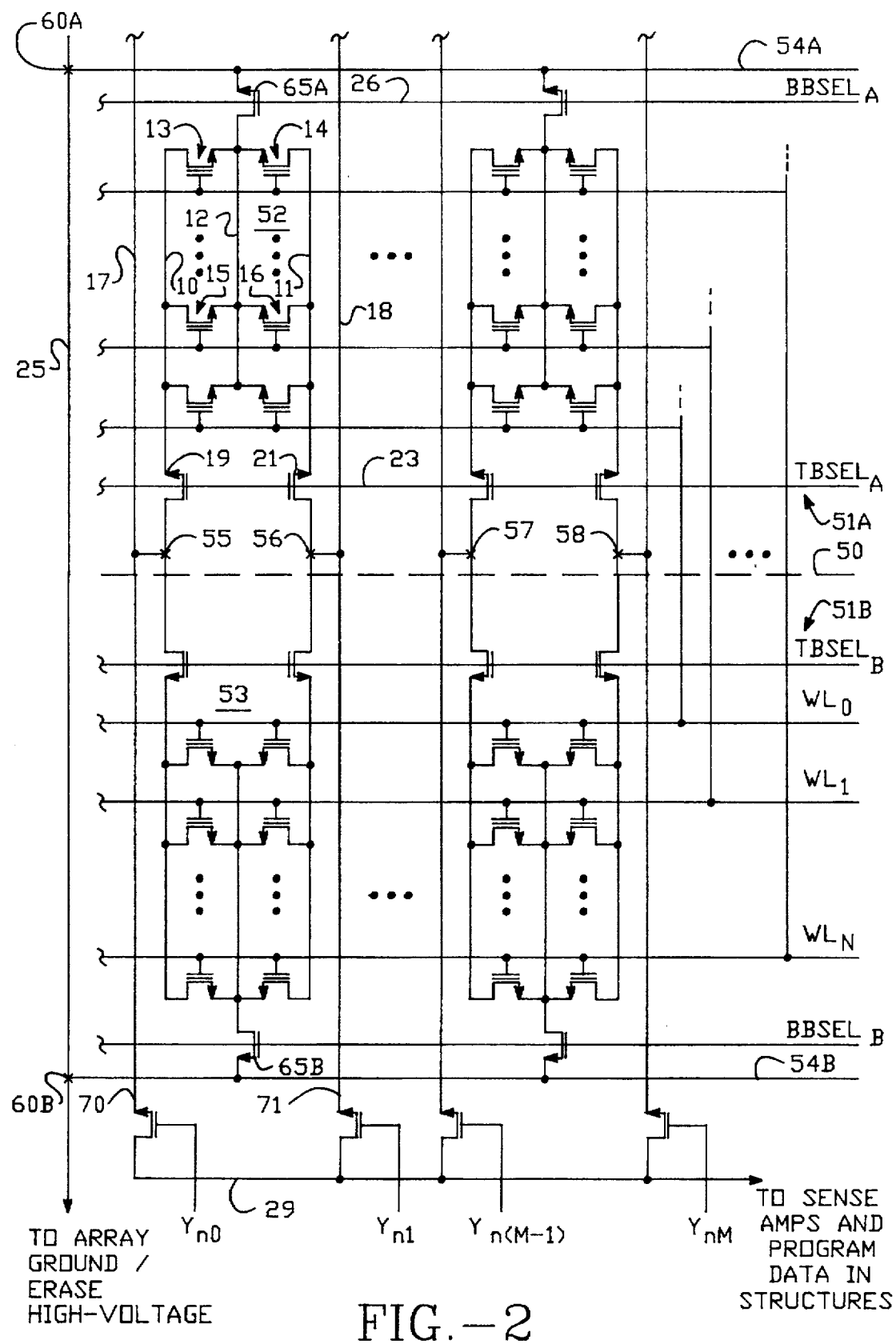
FIG. 2 is a circuit diagram showing a segmented array architecture for a floating gate memory cell device.

FIG. 2 illustrates the details of a segmentable array architecture in a drain-source-drain configuration of the floating gate memory circuit in which this invention may be implemented, and like that described U.S. Pat. No. 5,399,891, entitled NON-VOLATILE MEMORY CELL AND ARRAY ARCHITECTURE, issued Mar. 21, 1995 which is incorporated by reference herein. Other array architectures may be used, as well.

The circuit includes a first local bit line 10 and a second local bit line 11 which are implemented by buried diffusion conductors. Also, included is a local virtual ground line 12 implemented by buried diffusion. A plurality of floating gate transistors having drains and sources coupled to the local bit lines 10, 11 and local virtual ground line 12. Any number of these floating gate transistors in a single block may suffer from over-erasure as a result of the erase step mentioned above, and in varying degrees.

The drains of the first column of transistors, generally 13, are coupled to the first local bit line 10, and the drains of the second column of transistors, generally 14, are coupled to the second local bit line 11. The gates of the floating gate transistors are coupled to word lines $WL_0$ through $WL_N$, where each word line (e.g., $WL_1$) is coupled to the gate of a transistor (e.g., transistor 15) in the first local bit line 10 and a transistor (e.g., transistor 16) in the second local bit line 11. The transistors 15 and 16 can be considered a two transistor cell with a shared source diffusion.

The act of charging the floating gate is called the program step for the floating gate memory cell. This is accomplished on a byte by byte basis through hot electron injection by establishing a large positive voltage between the gate and the source, such as twelve volts, and a positive voltage between the drain and the source, such as six volts.

The act of discharging the floating gate is called the erase step for the floating gate memory cell. This is accomplished through the F-N (Fowler-Nordheim) tunneling mechanism between the floating gate and the source (source erase) or between the floating gate and the substrate (channel erase). The source erasing is performed by applying a positive bias to the source, such as twelve volts or seven volts, while the gate is grounded or negatively biased, such as minus seven volts. The channel erasing on a block basis is performed by applying a negative bias to the gate and/or a positive bias to the substrate.

Individual blocks of cells are controlled by select signals, that is, top block select signals $TBSEL_A$ and $TBSEL_B$ and bottom block select signals $BBSEL_A$ and $BBSEL_B$. The individual control of the blocks provides the ability to apply a repair pulse to selected local bit lines 10 and 11.

Still referring to FIG. 2, a first global bit line 17 and a second global bit line 18 are associated with each drain-source-drain block. The first global bit line 17 is coupled to the source of top block select transistor 19 through a metal-to-diffusion contact 55. Similarly, the second global bit line 18 is coupled to the source of top block select transistor 21 through a metal-to-diffusion contact 56. The drains of the top block select transistors 19, 21 are coupled to the first and second local bit lines 10 and 11, respectively. The gates of the top block selector transistors 19, 21 are thus controlled by a top block select signal $TBSEL_A$ on line 23.

In a similar manner, the gate of the bottom block select transistor 65A is controlled by a bottom block select signal $BBSEL_A$ across line 26. The local virtual ground line 12 is coupled to a virtual ground terminal across conductor 54A through bottom block selector transistor 65A. The drain of the bottom block select transistor 65A is coupled to the local virtual ground line 12. The source of the bottom block select transistor 65A is coupled to the conductor 54A. In this architecture, the conductor 54A is a buried diffusion conductor which extends to a metal-to-diffusion contact 60A at a position displaced horizontally through the array, which provides contact to a vertical metal virtual ground bus 25.

For sense amps and program data in structures, a data line 29 is coupled to the global bit lines 17 and 18 which extend vertically through the array to respective column select transistors 70, 71. Thus, the source of column select transistor 70 is coupled to global bit line 17, the gate of column select transistor 70 is coupled to a column decode signal $Y_{n0}$, and the drain of the column select transistor 70 is coupled to data line conductor 29.

The blocks of floating gate memory cells as shown in FIG. 1 are configured into a plurality of subarrays as illustrated in FIG. 2 which illustrates two subarrays within a larger integrated circuit. The subarrays are divided generally along dotted line 50 and include subarray 51A generally above the line 50 and subarray 51B generally below the line 50. A first group 52 of cells is laid out in a mirror image with a second group 53 of cells along a given bit line pair (e.g., 17, 18). As one proceeds up the bit line pair, the memory subarrays are flipped so as to share virtual ground conductors 54A, 54B (buried diffusion) and metal-to-metal diffusion contacts 55, 56, 57, 58. The virtual ground conductors 54A, 54B extend horizontally across the array to a vertical virtual ground metal line 25 through metal-to-diffusion contacts 60A, 60B. The subarrays repeat on opposite sides of the metal virtual ground line 25 so that adjacent subarrays share a metal virtual ground line 25. The metal virtual ground line 25 is coupled to array ground and erase high voltage circuitry. Thus, the subarray layout requires two metal contact pitches per column of two transistor cells for the global bit lines and one metal contact pitch for the metal ground line 25.

During a soft program pulse, driving the word line at slightly higher voltage creates a possibility that a higher current may be generated in the sector being soft programmed. This current is limited by a current limiter circuit on the source side of the cell. With reference to FIG. 2, the bottom block select transistor 65B or 65A acts as a current limiter. This transistor on its source side is connected to the array ground power supply, which is a generator to support zero volts or a positive voltage depending on the mode of operation. Thus bottom block select transistors 65A, 65B are sector decode transistors which also serve as current limiters during soft program. Other current limiting schemes, such as current mirror circuits, could be utilized as well.

The sector decode ability provided by the circuit of FIG. 2, allows the circuitry to be implemented which applies a drain disturb style soft program pulse only to selected segments of the array by applying about 5.5 volts to the local drain lines, while grounding the source.

Also, an alternative system will apply the soft program pulse of about 5.5 volts, or more depending on circuit parameters, through the source terminal of devices being soft programmed, while grounding the bit lines or drain terminals. The same segment-by-segment decoding, and word line drivers can be utilized in this source disturb approach.

Figure 3:
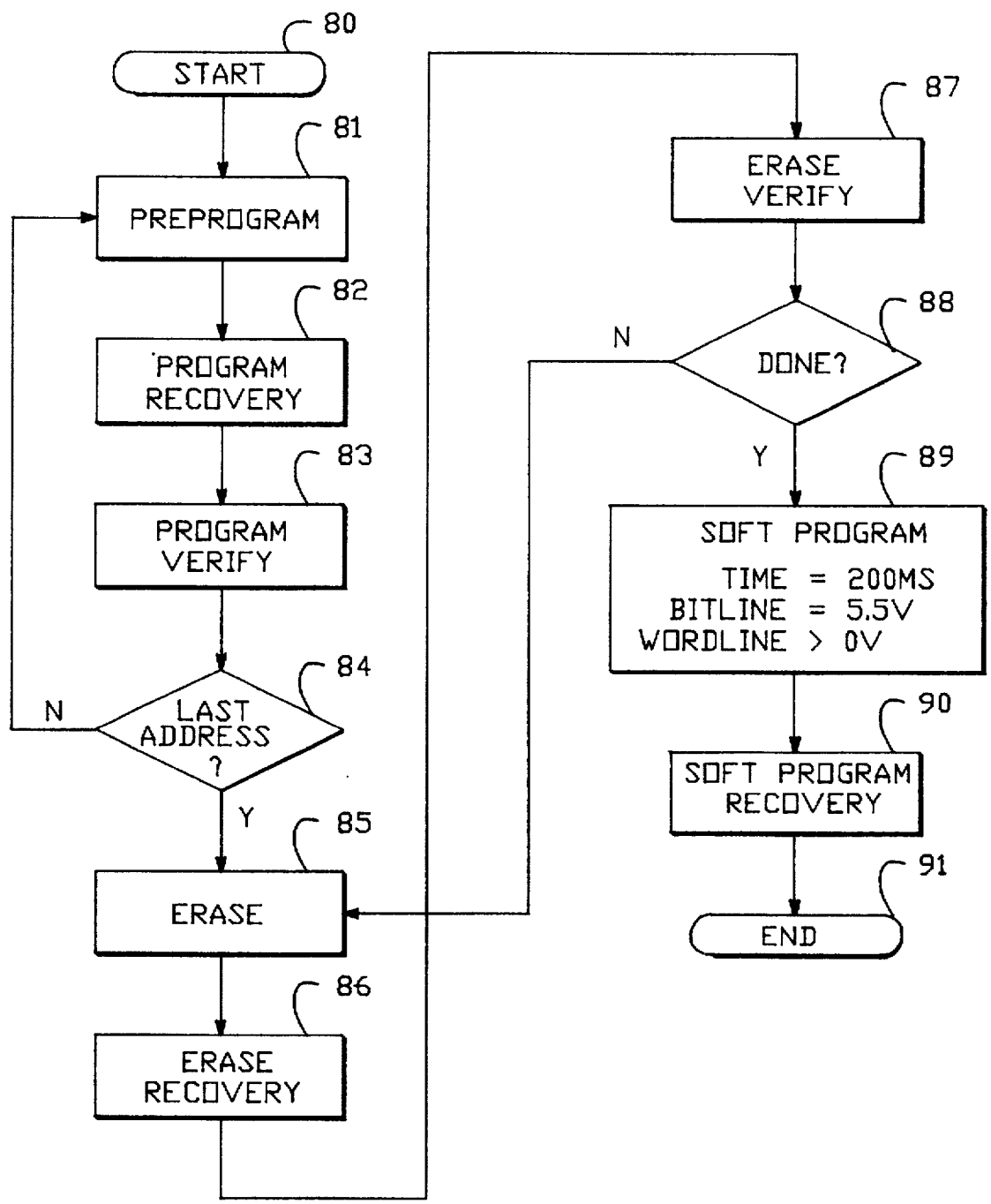
FIG. 3 is an overall flow chart of this invention.

Referring to FIG. 3, an overall flow chart of a chip or block erase process, including the soft program steps of this invention, is shown. After starting the erase operation (step 80), pre-programming is initiated for the chip or block selected for erase, through a host CPU or otherwise through command logic 5 (step 81). At step 82, a program recovery period occurs allowing the voltage to settle out or stabilize after pre-programming. At step 83, a program verify process occurs. The system then checks to see if the last address in the chip or block has been preprogrammed (step 84). If not, the process starting at the pre-programming step is repeated until all cells in the chip or block have been preprogrammed.

After pre-programming, the erase operation at step 85 is executed which is followed by the erase recovery period 86 to allow the erase voltage to settle out. Next, an erase verify operation 87 is performed. Then, the system checks to see if the erase process is complete at step 88. If not, it returns to step 85, performing the erase operation until complete. When complete, the soft program at step 89 is initiated in which the soft program pulse is applied to all cells in the entire chip or block subject of the erase operation in parallel. The soft program recovery occurs at step 90. The process ends at step 91.

Figure 4:
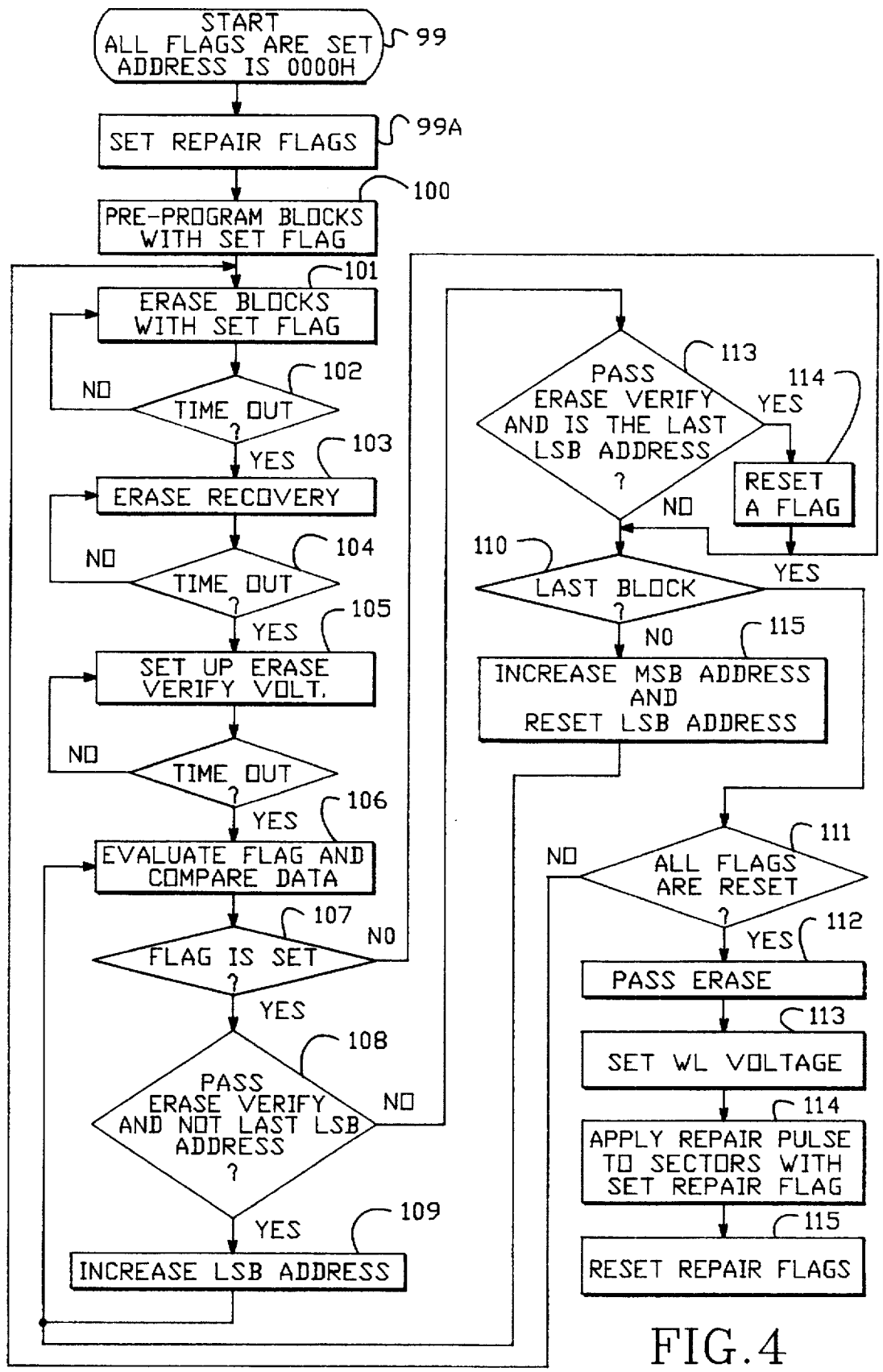
FIG. 4 is a more specific flow chart illustrating the sector erase and repair process of this invention.

FIG. 4 illustrates one embodiment of this invention including an algorithm for the embedded erase and repair process of this invention which is generally executed by the control circuit 2 using the block erase flags 3 and address counter 4 of FIG. 1. This embodiment maintains the word line voltage at ground or preferably slightly above ground during a 5.5 volt repair pulse across the bit line and the source terminals.

According to the embedded erase algorithm, an erase operation begins at step 99 with the setting of one or more flags indicating sectors of the array to be erased. For chip erase, all flags are set and the address counters are initialized to address zero. If a block erase operation is to be executed, the only flags for selected sectors are set. According to this embodiment of the present invention, repair flags are also set, one for each block erase flag, to identify sectors to receive the soft program repair pulse (step 99A). Next, a pre-program operation is executed on selected sectors (step 100).

In the next step, all the sectors having a set flag are erased (step 101). During the erase operations, the high voltages of the virtual ground line 25 are isolated from the unselected sectors by, for example, the BBSEL transistors. For blocks in the same sector, BBSEL has the same voltage level. BBSEL is driven with high voltage to pass array high voltage when the sector flag is set, and with zero volts when the sector flag is reset. This allows a sectored erase operation. Then the entire set of selected blocks is erased by applying energizing voltages as described above, segmented under control of the bottom block select transmitter.

Next, a timer waits for an erase timeout condition (step 102). After the timeout condition, an erase recovery phase is entered (step 103) Again, this recovery phase is timed as indicated at step 104.

After erase recovery, the erase verify voltages are set up (block 105). This operation is described in detail in U.S. Pat. No. 5,463,586 entitled ERASE AND PROGRAM VERIFICATION CIRCUIT FOR NON-VOLATILE MEMORY.

The next step is to evaluate the flag and test the data in each location inside the blocks having a set flag (block 106). This routine involves determining whether the flag is set (block 107). If it is set, the routine checks first for an erase verify pass and overflow of the least significant bit counter (block 108). If a pass is detected and the counter is not at the end of the block, then the least significant bit address is incremented (block 109). At this point, the algorithm loops back to block 106.

If the flag is not set, then the algorithm loops to block 110 where it tests to determine whether all flags have been reset. If all have been reset, or are in a reset state at the beginning of the routine, then the algorithm indicates that the erase is done (block 112). If all flags have not been reset, then the algorithm loops back to block 101 to re-erase blocks having a set flag.

If, at block 108, a cell did not pass erase verify, or passes but is the last LSB in the block, then the algorithm branches to block 113. In block 113, the algorithm again tests for erase verify pass and the end of the block. If the cell is at the end of the block and passes, then the erase flag for the block is reset (block 114). If the cell is not at the end of the block, the erase flag for the block is not reset at this time, then the MSB address is incremented to go the next block, and the LSB address is reset (block 115). At that point, the algorithm loops back to block 106 to loop through other blocks having a set flag for erase verify.

After erase verify, the soft program repair pulse is applied to blocks having a set repair flag. Thus, the word line voltage is initially set at ground or above, preferably at approximately 0.3 volts (step 113), but may be more or less. In this embodiment, that word line voltage is maintained while the repair pulse is applied for approximately 200 ms to the bit line to sectors having set repair flags (step 114). Finally, the repair flags are reset without a repair verify operation (step 115). During the repair pulse, top block select transistors of selected sectors are enabled in response to the repair flags, so that a repair voltage of 5.5 volts is applied to the buried drain lines to repair those over-erased cells which reside in the selected sectors (sector erase case) or the whole chip (chip erase case). The repair pulse may range, for example from about 3.5 volts to about 10.0 volts depending on the channel length and other cell parameters, on the repair pulse length, and on other factors.

Figure 5:
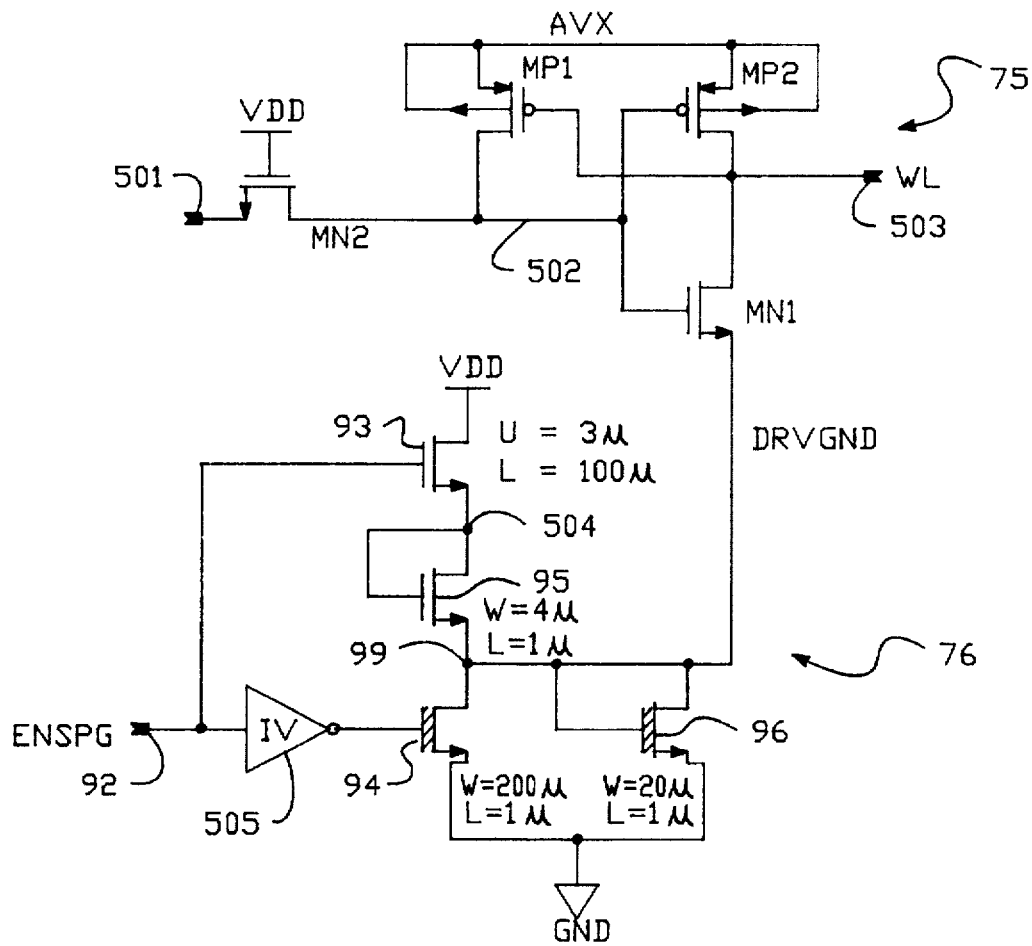
FIG. 5 is a circuit diagram showing a word line driver having a two level pull down according to this invention.

FIG. 5 illustrates a word line driver adapted for driving word lines in selected sectors to a value slightly above ground to speed up the soft program process over implementations in which the word line is pulled to ground during a soft program. The circuit in FIG. 5 includes a first input 501 which is connected to the word line decoder. The signal on input 501 is connected through pass transistor MN2 to node 502. Transistor MN2 is biased on by the voltage VDD connected to its gate. Node 502 is connected to the drain of n-channel transistor MP1. The source and n-well of transistor MP1 are coupled to the supply AVX. The gate of p-channel transistor MP1 is connected to the word line 503 (WL). Node 502 is also connected to the gate of p-channel transistor MP2 and the gate of n-channel transistor MN1. The source of transistor MP2 and the n-well of transistor MP2 are connected to the supply voltage AVX. The drain of transistor MP2 is connected to the word line 503. The drain of transistor MN1 is connected to the word line 503. The source of transistor MN1 is connected to a pull down driver circuit generally 76.

The pull down driver circuit 76 includes an enable soft program ENSPG input 92. Input 92 is connected to the gate of n-channel transistor 93, which has a width of about three microns and a length of about 100 microns. The drain of transistor 93 is connected to the supply VDD and the source of transistor 93 is connected to node 504. Node 504 is connected to the gate and drain of n-channel transistor 95 which has a width of about 4 microns and a length of about 1 micron. The source of transistor 95 is connected to node 99 which is also connected to the source of transistor MN1. Node 99 is connected across intrinsic n-channel transistors 94 and 96 to the ground terminal. Intrinsic n-channel transistor 96 has its gate and drain connected to node 99 and its source connected to ground. Transistor 96 has a width of about 20 microns and a length of about 1 micron. Transistor 94 has its drain connected to node 99 and its source connected to ground. The gate of transistor 94 is connected to the output of inverter 505. Transistor 94 has a width of about 200 microns and a length of about 1 micron. The input of inverter 505 is connected to the enable soft program ENSPG input 92.

During a soft program process, all word lines are selected by driving the input 501 high. This disables the pull up transistor MP2 while enabling the pull down transistor MN1. As the word line 503 is pulled down, transistor MP1 pulls up on node 502.

The pull down driver 76 during the enable soft program sequence receives a high enable soft program signal. This turns on transistors 93, 95, and 96, while turning off transistor 94. This creates a voltage divider which holds the word line voltage at node 503 above ground at about 0.3 volts in this embodiment. When the enable soft program pulse ends, the signal at node 92 goes low, turning off transistors 93 and 95, and turning on transistor 94. Transistor 94 is significantly larger than transistor 96, and pulls node 99 down essentially to the ground potential.

Turning to FIG. 6, another embodiment of this invention is shown. Here, the repair pulse is applied in two sequential steps. In the first step, the word line voltage is maintained at a first level above ground, and in the second step, the word line voltage is maintained at a second level above ground. Preliminarily, steps similar to those of FIG. 4 take place. Different, however, is that FIG. 6 shows that during steps 607 through 610, the word line voltage is maintained at two different levels while the repair pulse is applied to the bit line.

First, step 607 provides that the word line voltage is maintained above ground, e.g. between 0.1 volts and 0.2 volts, for a period of time, e.g. approximately 100 milliseconds. The first stage of the repair pulse is maintained during step 608. By first applying a lower word line bias during the first soft program steps 607 and 608, the current of the "over-erased" cells is less than would occur with higher word line voltage, yet the majority over-erased cells are pushed toward being "normal cells" (i.e. they recover the threshold voltage to a better value). Thus after the first soft program steps 607 and 608, some over-erased cells have been calibrated and the second step can be applied. The second steps 609 and 610 include setting the word line voltage to between approximately 0.4 volts and 0.5 volts, or more or less, which is applied for an additional period of time, e.g. approximately 100 milliseconds while the repair pulse is applied.

Accordingly, during the repair pulse, the word line voltage is driven in two stages, the first stage occurring during the 100 ms period while the word line voltage is maintained between approximately 0.1 volts and 0.2 volts, the second stage occurring during the 100 ms period while the word line voltage is maintained between approximately 0.4 volts and 0.5 volts. This two step process enhances the soft programming of the over-erased cells with less operating current and better operating efficiency requiring only approximately 200 ms for the entire repair process for the chip.

Turning to FIG. 7, a three level pull down driver circuit diagram including circuit dimensions is used in combination with the circuit of FIG. 8 to provide a word line driver for the two step embodiment of FIG. 6.

The three level pull-down driver of FIG. 7 operates to control the supply voltage at the node ZD2 701. The circuit has a first input at node 702 and a second input at node 703. The first input at node 702 is the enable soft program ENSPG pulse. The second input at node 703 is the control signal SPG1 for indicating the first stage of the soft program algorithm. The input at node 702 is connected to the gate of transistor M41, which has a width of 3 microns and a length of 1 micron. The drain of transistor M41 is connected to the supply VDD. The source of transistor M41 is connected to the source and n-well of p-channel transistor M42. This transistor is formed within a guard ring which is indicated by the asterisk. The gate and drain of transistor M42 are coupled to node 701. The node 701 is also coupled to the drain of n-channel transistor M43 which has a width of 250 microns and a length of about 0.8 microns. The source of transistor M43 is connected to ground.

Node 701 is also connected to the drain of n-channel transistor M47, having a width of about 100 microns and a length of about 0.8 microns, and to the drain and gate of intrinsic n-channel transistor M44. Transistor M44 has a width of about 350 microns and a length of about 1.6 microns. The sources of transistors M47 and M44 are connected to the drain of transistor M45. Transistor M45 has a width of about 15 microns and a length of about 1.6 microns. The gate of transistor M45 is connected to the node at the source of transistors M41 and M42. The source of transistor M45 is connected to ground 25.

The gate of transistor M43 is connected to the output of inverter 704, which has its input connected to the node 702 to receive the enable soft program pulse.

As mentioned above, using the driver of FIG. 7, the node ZD2 can be driven to three different levels. When the enable soft program pulse at node 702 is low, transistor M41 is off and transistor M43 is on. Transistor M43 pulls the node ZD2 essentially to ground. During the enable soft program pulse, the node 702 is high. This turns on transistor M41 and turns off transistor M43. When transistor M41 is on, the gate of transistor M45 is also pulled high turning M45 on. Also, when transistor M41 is on, transistor M42 is likewise on and pulls the gate of transistor M44 high turning on transistor M44. Thus, transistors M44 and M45 pull-down node ZD2 to a level above ground and less than about 0.5 volts. When the input at node 703 is high, this also turns on transistor M47, which further pulls down node ZD2 to a level of less than about 0.2 volts.

As mentioned above, the node 701 supplies the potential ZD2 to word line drivers in the array. A representative word line driver shown in FIG. 8. It receives the ZD2 signal on node 701 as indicated. Other inputs include the output of decoders for the word lines, IN on node 801, VXP on node 802, and XR on node 805. Furthermore, a positive voltage supply AVX is supplied on node 803. A negative voltage supply NVPP is supplied on node 804. The level of the supply of these signals is controlled by supply circuits, depending on the mode of operation of the circuit. Control signals PG1 and PG2 are used to select a voltage level for the word line 806 (WL).

When a signal IN and the signal XR are high, and the control signal PG1 is low and the control signal PG2 is high, then the value of ZD2 at node 701 is supplied to the word line.

The signal IN at node 801 is supplied to the source of n-channel transistor M10 which has its gate connected to the decode signal XR on node 805. The drain of transistor M10 is connected to node 825. Also, the drain of p-channel transistor M20 is connected to node 825. The source of transistor M20 and its n-well are connected to the supply AVX at node 803. When the control signal VXP on node 802 is low, node 825 is pulled high to the level of AVX. When VXP is high, transistor M20 is not involved in the circuit. Node 825 is connected to the gate of n-channel transistor M22 and the gate of p-channel transistor M21. The source and n-well of transistor M21 are connected to the supply AVX. The source of transistor M22 is connected to the node 701 to receive the signal ZD2.

The node between the drains of transistors M21 and M22 is labeled 832. Node 832 is connected through p-channel pass transistor M30 to the word line at node 806. The n-well of the transistor M30 is connected to a bias voltage AVW. The gate is connected to the control signal PG1. Node 806 at the word line is also connected through the p-channel pass transistor M31 to the negative supply NVPP at node 804. The n-well of transistor M31 is connected to a bias voltage AVW. The gate of transistor M31 is connected to the control signal PG2.

Using the circuit in FIG. 8, the WL 806 can obtain a voltage from the left path (by transistor M30) or the right path (by transistor M31). The left path is mainly used to supply a positive very high voltage (VPP level, such as 12.6 volts) for programming, regular read voltage level (such as 5 volts) two step voltages (such as the above described 0.1 volts and 0.4 volts) for soft programming, or ground. The right path is used to supply a negative voltage (such as −7 volts).

During certain modes of operation, the AVX supply may be switched from a read potential at VDD level (as low as 4.4 volts) to a high program potential VPP (as high as 12.6 volts). Also, the AVX changes states from the high program potential to the read potential. In this case, the ZD2 line 701 will be pushed toward a negative voltage through M22.

By adding guard rings in the circuit of FIG. 7, it is possible to prevent a latch up problem caused by this negative push on ZD2. A well strapped p-substrate and n-well (so called "guard ring") may be used to avoid the latch-up problem. In such a case, guard rings (identified as a double astrix next to M42 of FIG. 7, * *) are positioned on M42 for latch up prevention. Also during the switch of AVX from a VPP level back to VDD level, a negative spike on ZD2 can damage M43, M44, M45 and M47. Thus, is preferable to put guard rings (identified as a single astrix next to M43, M44, M45 and M47 of FIG. 7, *) on these transistors as well.

FIG. 9 illustrates the circuitry for driving the top block select transistors, corresponding to the transistors 19 and 21 in FIG. 2, in order to enable the soft program pulse of about 5.5 volts to get into the buried drain lines, e.g. lines 10 and 11 of FIG. 2, on a sector by sector basis. The driver of FIG. 9 is used in connection with the sector erase algorithm described in the above referenced U.S. Pat. No. 5,414,664, which is incorporated by reference as fully set forth herein. According to the sector erase algorithm described in such a patent, each sector has associated with it a block erase flag. According to the present invention, a repair flag is set for sectors to be erased in the chip in addition to the block erase flag, and cleared after the soft program cycle. Thus, according to one embodiment, four top block select signals (TBSEL of FIG. 2), which are used to decode four sets of local bit lines, each local bit line thirty-two word lines deep, in the array, share a single driver, such as shown in FIG. 9. These four thirty-two word line segments of the array correspond to a single sector. There is one flag per sector in this design.

The driver is connected to the top block select signal TBSEL on line 901 (labelled TBSEL in FIG. 2), to pull it high during the soft program pulse for a selected sector. The signal is controlled by the sector repair flag in S-R flip-flop 904, and the enable soft program signal ENSPG on line 903. The signal on line 902 is supplied at the output of a corresponding block erase flag register (not shown) and is connected to the set-reset latch 904. This latch has a reset signal RESALL on line 905 connected to the reset input.

When the flag 902 goes high, the latch 904 is set high, which enables the NAND gate 906 to switch in response to the enable soft program signal on line 903. During an enable soft program pulse, if the flag for the corresponding sector is set, then the signal on line 907 is driven low. Else, the signal line 907 will be high for unselected sectors. NAND gate 908 controls the block select signal on line 901. During an enable soft program pulse on line 903, the NAND gate 908 is controlled by the signal line 907 which is low for selected sectors. Thus, a selected sector will have a high value at the output of NAND gate 908. This is supplied through the pass gate 910 to the node 901 driving the block select transistor. Pass gate 901 is an intrinsic device having a width of about 20 microns and a length of about 2 microns.

Node 901 is coupled to the pull-up circuitry generally 911. The pull-up circuitry generally 911 includes an n-channel transistor M48 (15 microns wide by 2 microns long) having its gate and drain connected to a high programming potential. The source of transistor M48 is connected to the drain of transistor M42 (25 microns wide by 1.8 microns long) which has its gate connected to node 901, and its source connected to node 912. Node 912 is connected to the drain and gate of transistor M43, which has its source connected to node 901. Transistor M43 is an intrinsic device having a width of about 25 microns and a length of about 3 microns. Node 912 is also connected to the gate of transistor M45 (3 microns wide by 289.33 microns long) which is connected as a capacitor. The source and drain of transistor M45 are connected to the clock signal on line 913. When node 901 is high under control of the NAND gate 908, transistor M42 turns on, which results in pulling up node 901 to levels sufficient to pass about 5.5 volts through the block select transistor to the buried drain lines, when the clock signal 913 is enabled.

As indicated in the figure, a similar set of circuitry on the right side is included, represented by the box 914. The RESALL signal on line 905 is asserted to reset all repair flags at the end of a soft program cycle.

Using the circuitry of FIGS. 7–9, all cells in the selected sectors are connected simultaneously to the soft program pulse through the block select transistor decoding. The word lines in unselected sectors are at a low enough value that they do not disturb properly erased cells. Thus only selected sectors receive the program pulse through selected TBSEL transistors. Note that in this embodiment all of the wordlines (selected or not) are driven to ground, 0.1 volts or 0.4 volts at the same time. It is the TBSEL transistors which are used to select the sectors being repaired. Further, selected sectors receive the pulse simultaneously. This ensures that a fast soft program process for entire sectors or an entire array at once. Since the erased healthy cells are not disturbed during the soft program pulse, and leaky cells are limited to small numbers within a given sector, the operating current is controlled. Thus, soft programming is accomplished for selected sectors efficiently and quickly, and repairs over-erased cells very well.

FIG. 10 is a graph showing the performance of the soft program pulse for over-erased cells which start out with a threshold of about negative one volts along trace 1000, over-erased cells which start out with a threshold of about zero volts on trace 1001, healthy cells with a threshold of about 1.6 volts on trace 1002, and healthy cells with a threshold of about 2.2 volts on trace 1003. The chart shows the length of the soft programming pulse on logarithmic scale of seconds on the horizontal axis, and the cell threshold on the vertical axis.

As can be seen by traces 1002 and 1003, healthy cells are unaffected by a soft program pulse for as long as ten seconds, because the threshold voltages remain substantially constant over the entire graph. This is true even though the gate voltage on the trace 1003 is raised to about 0.5 volts, illustrating that no significant disturbance of healthy cells occurs during the soft programming algorithm of the present invention. As can be seen with reference traces 1000 and 1001, where the drain voltage is about 5 volts and the gate voltage is about 0.2 volts during the entire pulse, the traces converge into a region where the threshold voltage is about 1 volt after 200 milliseconds.

Accordingly, this invention provides repairing over-erased cells block-by-block and without a repair verify operation. Moreover, this invention includes applying a repair pulse, maintaining the word line at a voltage at ground or above, such as between approximately 0.1 volts and 0.5 volts. Moreover, this invention includes applying a repair pulse to the erased cells in sequential two stages. In the first stage, the word line voltage is maintained between approximately 0.1 volts and 0.2 volts for approximately 100 milliseconds. In the second stage, the word line voltage is maintained between approximately 0.4 volts and 0.5 volts for approximately 100 milliseconds.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A floating gate memory integrated circuit, comprising:
a set of floating gate memory cells arranged in a plurality of rows and columns;
a plurality of drain lines coupled to drain terminals of respective columns of cells in the set;
a plurality of source lines coupled to source terminals of respective columns of cells in the set;
a plurality of word lines coupled to control gate terminals of respective rows of cells in the set;
a control circuit, coupled to the pluralities of drain lines, source lines and word lines, for setting threshold voltages of the cells in the set to a low threshold state, including voltage supply circuits to supply a voltage sequence to lower the thresholds of cells which results in some cells having thresholds lowered below a selected limit of threshold voltages, and then to supply a repair pulse during a repair time interval across the plurality of source lines and the plurality of drain lines, while setting the voltage on the plurality of word lines to a level below the selected limit.

2. The integrated circuit of claim 1, wherein said control circuit includes circuitry to pull the plurality of word lines substantially to ground during the repair pulse.

3. The integrated circuit of claim 1, wherein said control circuit includes circuitry to pull the plurality of word lines to a level above ground but less than about one volt during the repair pulse.

4. The integrated circuit of claim 1, wherein said control circuit includes circuitry to pull the plurality of word lines to a level above ground but less that about 0.5 volts during the repair pulse.

5. The integrated circuit of claim 1, wherein said control circuit includes circuitry to drive the plurality of word lines to a first level during a first time interval and to a second level higher than the first level during a second time interval within the repair pulse.

6. The integrated circuit of claim 1, wherein the repair time interval lasts about 200 milliseconds.

7. The integrated circuit of claim 5, wherein the repair time interval lasts about 200 milliseconds.

8. The integrated circuit of claim 1, wherein the circuitry applies the repair pulse by driving the plurality of drain lines to a positive voltage and driving the plurality of source lines to substantially a ground potential.

9. The integrated circuit of claim 1, wherein the circuitry applies the repair pulse by driving the plurality of source lines to a positive voltage and driving the plurality of drain lines to substantially a ground potential.

10. The integrated circuit of claim 1, including current limiting circuitry on at least one of the plurality of drain lines and the plurality of source lines.

11. A floating gate memory integrated circuit, comprising:
an array of floating gate memory cells arranged in a plurality of rows and columns including a plurality of sectors, each sector including a plurality of drain lines coupled to drain terminals of respective columns of cells in the sector;
a plurality of source lines coupled to source terminals of respective columns of cells in the sector; and
a plurality of word lines coupled to control gate terminals of respective rows of cells in the sector;
a control circuit, coupled to the pluralities of drain lines, source lines and word lines in the plurality of sectors, for setting threshold voltages of the cells in a selected sector to a low threshold state, including voltage supply circuits to supply a voltage sequence to lower the thresholds of cells in the selected sector which results in some cells having thresholds lowered below a selected limit of threshold voltages, and then to supply a repair pulse to the selected sector, during a repair time interval across the plurality of source lines and the plurality of drain lines, while setting the voltage on the plurality of word lines to a level below the selected limit.

12. The integrated circuit of claim 11, wherein said control circuit includes circuitry to pull the plurality of word lines substantially to ground during the repair pulse.

13. The integrated circuit of claim 11, wherein said control circuit includes circuitry to pull the plurality of word lines to a level above ground but less than about one volt during the repair pulse.

14. The integrated circuit of claim 11, wherein said control circuit includes circuitry to pull the plurality of word lines to a level above ground but less that about 0.5 volts during the repair pulse.

15. The integrated circuit of claim 11, wherein said control circuit includes circuitry to drive the plurality of word lines to a first level during a first time interval and to a second level higher than the first level during a second time interval within the repair time interval.

16. The integrated circuit of claim 11, wherein the repair time interval lasts about 200 milliseconds.

17. The integrated circuit of claim 15, wherein the repair time interval lasts about 200 milliseconds.

18. The integrated circuit of claim 11, wherein the circuitry applies the repair pulse by driving the plurality of drain lines to a positive voltage and driving the plurality of source lines to substantially a ground potential.

19. The integrated circuit of claim 11, wherein the circuitry applies the repair pulse by driving the plurality of source lines to a positive voltage and driving the plurality of drain lines to substantially a ground potential.

20. The integrated circuit of claim 11, including current limiting circuitry on at least one of the plurality of drain lines and the plurality of source lines in the plurality of sectors.

21. The integrated circuit of claim 11, wherein the array includes a plurality of global bit lines, and sector drain select transistors coupling bit lines in the plurality of bit lines with corresponding drain lines in the plurality of drain lines of a set of sectors in the array, and the circuitry supplies the repair pulse to the plurality of drain lines in the selected sector through the sector drain select transistors.

22. The integrated circuit of claim 21, wherein the array includes a source supply line, and sector source select transistors coupling the source supply line with the plurality of source lines of a set of sectors in the array, and the circuitry supplies the repair pulse to the plurality of source lines in the selected sector through the sector source select transistors.

23. In a floating gate integrated circuit having a memory array including a plurality of blocks of floating gate memory cells configured to be programmed and erased, wherein each of said cells has a drain, a source and a control gate, and wherein the control gates of said cells are in communication with word lines, a method for erasing said programmed floating gate memory cells, comprising the steps of:

erasing cells;

maintaining said word lines at a predetermined word line voltage level;

generating a repair pulse having a repair voltage level; and during said word line voltage maintaining step, applying said repair pulse to selected blocks of said plurality of blocks of floating gate memory cells independent of others of said plurality of blocks of floating gate cells; and wherein blocks in the plurality of blocks include cells from at least two columns and cells from at least two rows.

24. A method as recited in claim 23, wherein repair pulse repairs over-erased cells so that they may be reprogrammed absent a previously applied repair verify operation.

25. A method as recited in claim 23, including maintaining said word line voltage level between approximately above ground and 0.5 volts.

26. A method as recited in claim 23, including:

maintaining said word line voltage level in two stages including a first, lower voltage stage and a second, higher voltage stage.

27. A method recited in claim 26, wherein during said first stage, said method includes:

maintaining said word line voltage below approximately 0.2 volts.

28. A method as recited in claim 26, wherein during said second stage, said method includes:

maintaining said word line voltage level between approximately 0.3 volts and 0.5 volts.

29. A floating gate integrated circuit, comprising:

a memory array including floating gate memory cells configured to be programmed and erased, wherein each of said cells has a drain, a source and a control gate, and wherein the control gates of said cells are in communication with a word line capable of maintaining a word line voltage;

control circuits, for erasing floating gate memory cells in the memory array, which generates an over-erased cell; and said control circuits further configured to generate a repair pulse, wherein said repair pulse across the sources and drain of floating gate memory cells, while a voltage on the word lines is provided in two stages, a first stage in which the word line voltage is at a first lower voltage level, the second stage in which the word line voltage is at a second higher voltage level.

30. A circuit as recited in claim 29, wherein said first stage of the repair pulse is approximately 100 ms in duration and said second stage of said repair pulse which is approximately 100 ms in duration.

31. A circuit as recited in claim 29, wherein said control circuits are configured to maintain said word line voltage between approximately above ground and 0.5 volts while said repair pulse is applied to said erased cell.

32. A circuit as recited in claim 29, wherein during said first stage, said word line voltage is between approximately ground and about 0.2 volts.

33. A circuit as recited in claim 29, wherein during said second stage, said word line voltage is between approximately 0.3 volts and 0.5 volts.

34. A floating gate memory integrated circuit, comprising:

an array of floating gate memory cells arranged in a plurality of rows and columns including a plurality of sectors, each sector including a plurality of drain lines coupled to drain terminals of respective columns of cells in the sector;

a plurality of source lines coupled to source terminals of respective columns of cells in the sector; and a plurality of word lines coupled to control gate terminals of respective rows of cells in the sector;

a plurality of sector flags indicating sectors of the array to be erased in response to input signals;

a control circuit, coupled to the plurality of sector flags, and to the pluralities of drain lines, source lines and word lines in the plurality of sectors, for setting threshold voltages of the cells in selected sectors indicated by the plurality of sector flags to a low threshold state, including voltage supply circuits to supply a voltage sequence to lower the thresholds of cells in the selected sector which results in some cells having thresholds lowered below a selected limit of threshold voltages, and then to supply a repair pulse to the selected sectors indicated by the plurality of sector flags, during a repair time interval across the plurality of source lines and the plurality of drain lines, while setting the voltage on the plurality of word lines to a level below the selected limit.

35. The integrated circuit of claim 34, wherein said control circuit includes circuitry to pull the plurality of word lines substantially to ground during the repair pulse.

36. The integrated circuit of claim 34, wherein said control circuit includes circuitry to pull the plurality of word lines to a level above ground but less than about one volt during the repair pulse.

37. The integrated circuit of claim 34, wherein said control circuit includes circuitry to pull the plurality of word lines to a level above ground but less that about 0.5 volts during the repair pulse.

38. The integrated circuit of claim 34, wherein said control circuit includes circuitry to drive the plurality of word lines to a first level during a first time interval and to a second level higher than the first level during a second time interval within the repair time interval.

39. The integrated circuit of claim 34, wherein the repair time interval lasts about 200 milliseconds.

40. The integrated circuit of claim 38, wherein the repair time interval lasts about 200 milliseconds.

41. The integrated circuit of claim 34, wherein the circuitry applies the repair pulse by driving the plurality of drain lines to a positive voltage and driving the plurality of source lines to substantially a ground potential.

42. The integrated circuit of claim 34, wherein the circuitry applies the repair pulse by driving the plurality of source lines to a positive voltage and driving the plurality of drain lines to substantially a ground potential.

43. The integrated circuit of claim 34, including current limiting circuitry on at least one of the plurality of drain lines and the plurality of source lines in the plurality of sectors.

44. The integrated circuit of claim 34, wherein the array includes a plurality of global bit lines, and sector drain select transistors coupling bit lines in the plurality of bit lines with corresponding drain lines in the plurality of drain lines of a set of sectors in the array, and the circuitry supplies the repair pulse to the plurality of drain lines in the selected sector through the sector drain select transistors, in response to the plurality of sector flags.

45. The integrated circuit of claim 44, wherein the array includes a source supply line, and sector source select transistors coupling the source supply line with the plurality of source lines of a set of sectors in the array, and the circuitry supplies the repair pulse to the plurality of source lines in the selected sector through the sector source select transistors, in response to the plurality of sector flags.

46. In a floating gate integrated circuit having a memory array including a plurality of blocks of floating gate memory cells configured to be programmed and erased, wherein each of said cells has a drain, a source and a control gate, and wherein the control gates of said cells are in communication with word lines, a method for erasing said programmed floating gate memory cells, comprising the steps of:

erasing cells;

maintaining said word lines at a predetermined word line voltage level;

generating a repair pulse having a repair voltage level;

during said word line voltage maintaining step, applying said repair pulse to selected blocks of said plurality of blocks of floating gate memory cells independent of others of said plurality of blocks of floating gate cells; and maintaining said word line voltage level between approximately above ground and 0.5 volts.

47. In a floating gate integrated circuit having a memory array including a plurality of blocks of floating gate memory cells configured to be programmed and erased, wherein each of said cells has a drain, a source and a control gate, and wherein the control gates of said cells are in communication with word lines, a method for erasing said programmed floating gate memory cells, comprising the steps of:

erasing cells;

maintaining said word lines at a predetermined word line voltage level;

generating a repair pulse having a repair voltage level;

during said word line voltage maintaining step, applying said repair pulse to selected blocks of said plurality of blocks of floating gate memory cells independent of others of said plurality of blocks of floating gate cells; and maintaining said word line voltage level in two stages including a first, lower voltage stage and a second, higher voltage stage.

48. A method recited in claim 47, wherein during said first stage, said method includes:

maintaining said word line voltage below approximately 0.2 volts.

49. A method as recited in claim 47, wherein during said second stage, said method includes:

maintaining said word line voltage level between approximately 0.3 volts and 0.5 volts.

50. A method as recited in claim 23, including generating the repair pulse absent a previously applied repair verify operation.

* * * * *